United States Patent
Ogushi et al.

(10) Patent No.: US 12,417,812 B2
(45) Date of Patent: Sep. 16, 2025

(54) FAILURE ANALYSIS DEVICE AND FAILURE ANALYSIS METHOD

(71) Applicant: RENESAS ELECTRONICS CORPORATION, Tokyo (JP)

(72) Inventors: Toru Ogushi, Tokyo (JP); Sho Uesugi, Tokyo (JP); Yukihisa Funatsu, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 166 days.

(21) Appl. No.: 18/478,207

(22) Filed: Sep. 29, 2023

(65) Prior Publication Data
US 2025/0111882 A1    Apr. 3, 2025

(51) Int. Cl.
*G11C 29/10* (2006.01)
*G11C 29/18* (2006.01)
*G11C 29/38* (2006.01)

(52) U.S. Cl.
CPC .............. *G11C 29/10* (2013.01); *G11C 29/18* (2013.01); *G11C 29/38* (2013.01); *G11C 2029/1806* (2013.01)

(58) Field of Classification Search
CPC ......... G11C 29/10; G11C 29/18; G11C 29/38; G11C 2029/1806; G11C 29/32; G11C 29/44; G11C 2029/0401; G11C 2029/3202; G11C 29/56008
See application file for complete search history.

(56) References Cited

U.S. PATENT DOCUMENTS 5,471,482 A * 11/1995 Byers ................ G11C 29/10
                                              714/719
11,288,435 B1  3/2022 Ogushi

* cited by examiner

*Primary Examiner* — Xiaochun L Chen
(74) *Attorney, Agent, or Firm* — Rimon P.C.

(57) ABSTRACT

A failure analysis device is for analyzing a failure of the semiconductor device equipped with a logic circuit and a memory circuit. It has a storage device and a processor. The storage device stores fail bit data obtained by testing the memory circuit and failure diagnosis data obtained by failure diagnosis for test results of the logic circuit. The processor extracts the fail I/O value from the fail bit data, extracts the data of the memory connection port which is the connection port to the memory circuit from among the estimated failure parts included in the failure diagnosis data, and determines match/not-match between the fail I/O value and the port ID value included in the data of the memory connection port.

10 Claims, 11 Drawing Sheets

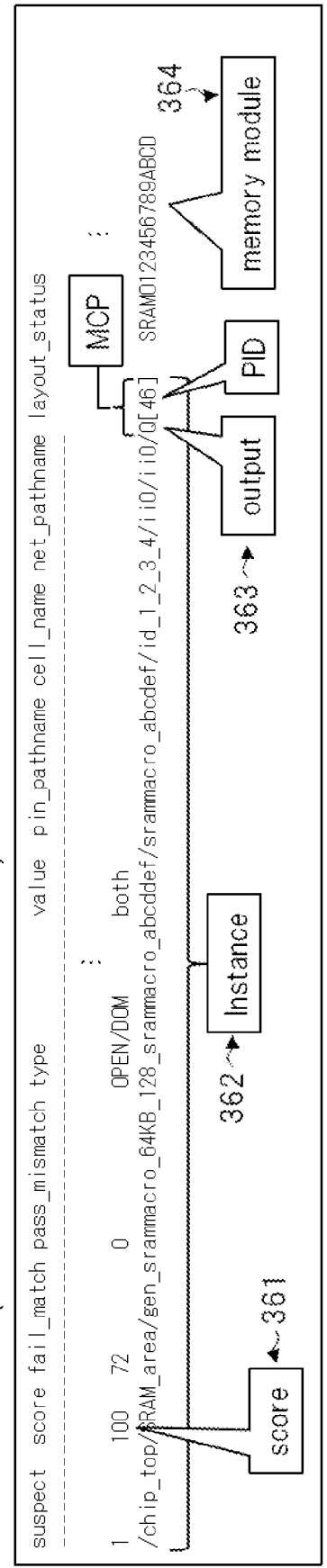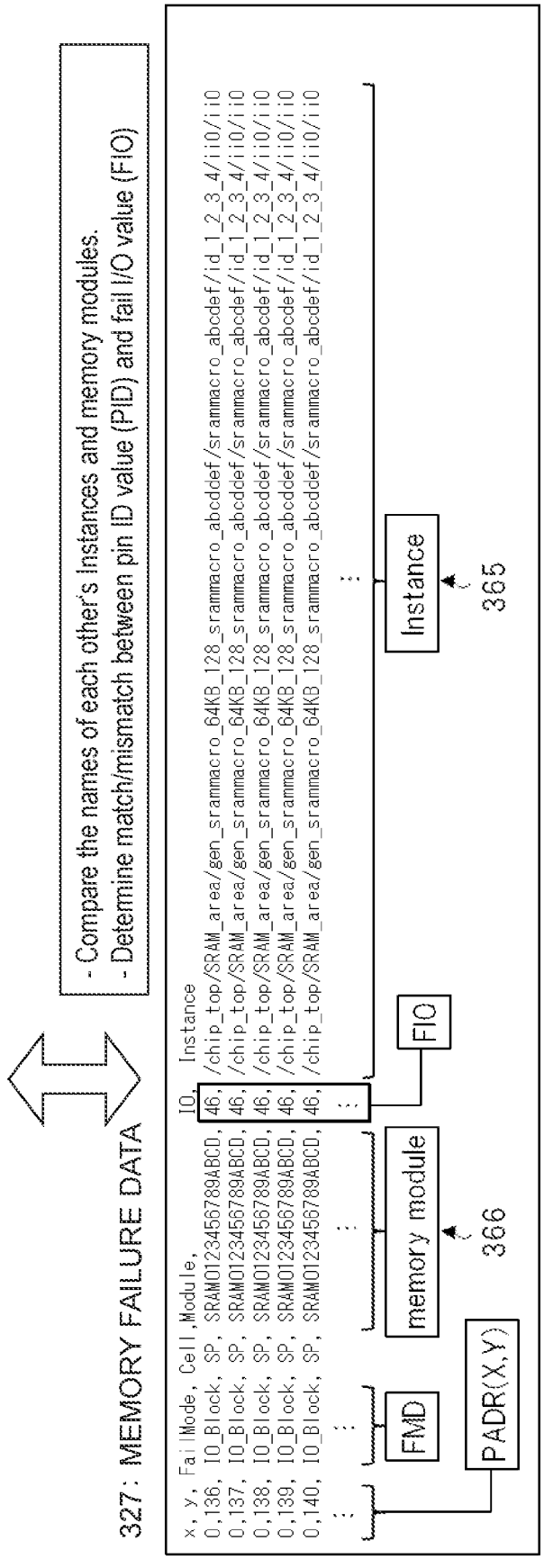
FIG. 3

| FAIL MODE OF FAIL BIT | TERMINAL MATCHING | ESTIMATED FAILURE PART |
|---|---|---|
| I/O BLOCK FAIL | MATCH | (AR1) LOGIC CIRCUIT or (AR2) MCP RELATED PART IN PERIPHERAL CIRCUIT |
| | NOT-MATCH | (AR2) PERIPHERAL CIRCUIT ALL AREA |
| OTHER FAIL | - | (AR3) TARGET PART IN MEMORY ARRAY (or ITS SURROUNDING) |

EFP: ESTIMATED FAILURE PART

FIG. 9

340 EDA DATA scan chain name : edt_channel3 ~370
scan chain name : edt_channel2 ~370 scan chain name : edt_channel1 ~370
scan-in pin : pad_scanin ~371
scan-out pin : fbs_scanout ~372

373 374 375 341 376

| FF No. | Instance | Cell | Input | Output | COORDINATE (LOWER LEFT -- UPPER RIGHT) |
|---|---|---|---|---|---|
| 157 | .../id_4_3/i0/i0/Q[46] | SFF-1 | D | Q | (110, 120) - (111, 121) |
| 156 | .../id_4_3/i0/i0/Q[45] | SFF-1 | D | Q | (105, 115) - (106, 116) |
| 155 | .../id_4_3/i0/i0/Q[44] | SFF-2 | D | Q | (100, 110) - (101, 111) |
| ⋮ | | | | | |
| 2 | .../id_4_3/i0/i0/Q[1] | SFF-2 | D | Q | (-200, -190) - (-199, -189) |
| 1 | .../id_4_3/i0/i0/Q[0] | SFF-1 | D | Q | (-205, -195) - (-204, -194) |

345: SCAN CHAIN DATA

| FAIL MODE OF FAIL BIT | PORT MATCHING | ESTIMATED FAILURE PART |
|---|---|---|
| I/O BLOCK FAIL | MATCH | (AR1) LOGIC CIRCUIT or (AR2a) MCP RELATED PART IN CONNECTING CIRCUIT |
| | NOT-MATCH | (AR2b) ARRAY CONTROL CIRCUIT ALL AREA |
| OTHER FAIL | - | (AR3) TARGET PART IN MEMORY ARRAY (or ITS SURROUNDING) |

FAILURE ANALYSIS DEVICE AND FAILURE ANALYSIS METHOD

BACKGROUND

The present invention relates to a failure analysis device and a failure analysis method.

There is disclosed technique listed below.

[Patent Document 1] U.S. Pat. No. 11,288,435

Patent Document 1 shows a failure analysis device capable of improving the efficiency of the failure analysis. The failure analysis device displays the position of the physical coordinates of the fail bit in the memory and the logic failure part using the layout tool to associate the memory failure with the logic failure. In this association, the failure analysis device extracts the logic failure part having the shortest total distance from the plurality of fail bits from among the plurality of logic failure parts, and determines that the extracted logic failure part is related.

SUMMARY

Generally, logic failure analysis and memory failure analysis are performed independently, because the analysis methods are different from each other. On the other hand, in recent years, a semiconductor device in which a logic circuit and a memory circuit are mixed, for example, an SoC (System on Chip) for a vehicle or the like is widely used. When such a logic circuit in the semiconductor device is tested, a memory circuit may be pointed out as an estimated failure part. Specifically, for example, the port for accessing the memory circuit in the logic circuit may be pointed out as the estimated failure part.

However, in this case, the failure part which is the root cause of the failure occurrence is not always present in the logic circuit, may be present in the memory circuit. Similarly, if a fail bit is generated by testing a memory circuit in a semiconductor device, a failure part that is a root cause of the fail bit may not always exist in the memory circuit, but may exist in the logic circuit.

Therefore, in either case, in order to identify or narrowing the failure part, for example, a certain wide area, it is necessary to perform emission analysis or the like. However, emission analysis leads to an increase in analysis man-hours. On the other hand, in order to increase the yield of the semiconductor device, it is necessary to identify the failure part, narrowing down. Therefore, it is desirable to identify the failure part without emission analysis or the like, or an efficient analysis method capable of narrowing down.

As such a method, for example, as shown in Patent Document 1, there is a method of identifying a logic failure part having the shortest total distance to a plurality of fail bits, as a failure part related to the fail bits. However, in some layouts, the fail bit may be associated with the longest failure part rather than the shortest failure part having a distance from the fail bit among the plurality of logic failure parts. Therefore, in practice, it was necessary to carry out the collation between the layout and the circuit diagram, etc., separately, and the increase in analysis man-hours could be generated.

Furthermore, when identifying the failure part by distance calculation based on the physical coordinates, for example, in the case such as shrinking the semiconductor device, there is a possibility that an error occurs. Specifically, for example, the physical coordinates on the layout tool calculated from the fail bit may deviate from the physical coordinates of the fail bit in the actual semiconductor device. This is because, for example, in GDS-II and the like, which are standard formats of layout data, rounding errors occur in the coordinates when shrinking is performed. Thus, if an error occurs in the physical coordinates on the layout tool, the distance calculation may not be performed correctly.

Other objects and novel features will become apparent from the description of this specification and the accompanying drawings.

Therefore, the failure analysis device of an embodiment is for analyzing a failure of the semiconductor device equipped with a logic circuit and a memory circuit, and has a storage device and a processor. The storage device stores fail bit data obtained by testing the memory circuit and failure diagnosis data obtained by failure diagnosis for test results of the logic circuit. The processor extracts the fail I/O value from the fail bit data, extracts the data of the memory connection port which is the connection port to the memory circuit from among the estimated failure parts included in the failure diagnosis data, and determines match/not-match between the fail I/O value and the port ID value included in the data of the memory connection port.

By using the failure analysis device of an embodiment, it is possible to increase the efficiency of the failure analysis.

BRIEF DESCRIPTION OF THE DRAWINGS

FIG. 3 is a diagram illustrating an example of main processing contents of the estimated failure part limiting unit in FIG. 2.

FIG. 9 is a diagram illustrating an exemplary EDA data of FIGS. 7 and 8.

DETAILED DESCRIPTION

Figure 1:
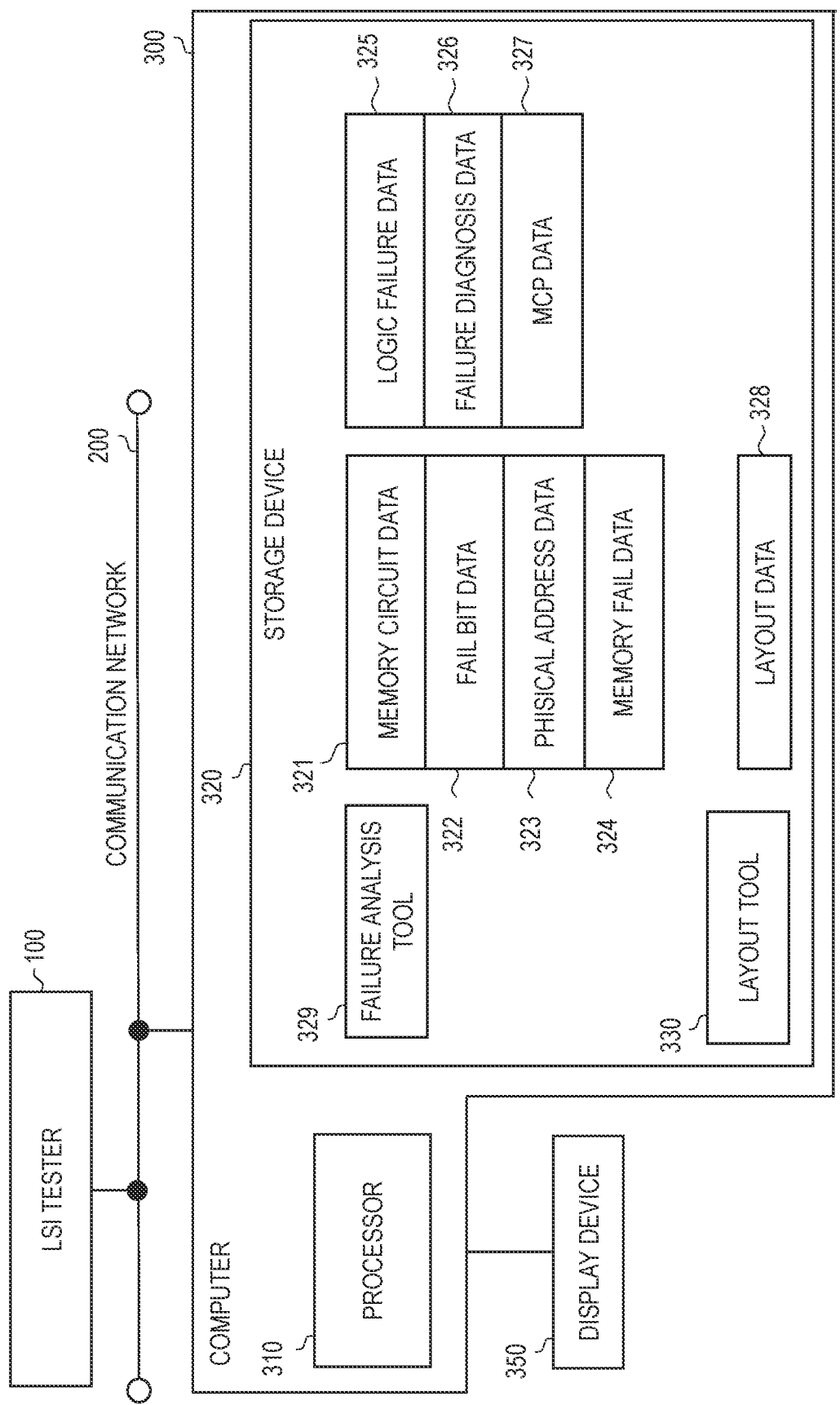
FIG. 1 is a schematic diagram showing a configuration example of a failure analysis system according to a first embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other.

In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiments, it is needless to say that the constituent elements (including element steps and the like) are not necessarily essential except in the case where they are specifically specified and the case where they are considered to be obviously essential in principle.

Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

First Embodiment (Configuration of Failure Analysis System)

FIG. 1 is a schematic diagram showing a configuration example of a failure analysis system according to the first embodiment. The failure analysis system shown in FIG. 1 includes an LSI (Large Scale Integration) tester 100, a communications network 200, a computer 300 and a display device 350. The communication network 200 may be, for example, a wired LAN (Local Area Network) or a wireless LAN, for connecting the LSI tester 100 and the computer 300. The display device 350 may be, for example, a liquid crystal display or an organic EL (Electro Luminescence) display or the like and displays various information based on instructions from the computer 300.

For example, the LSI tester 100 is constituted by a logic tester or the like. Further, the device under test is a semiconductor device equipped with a logic circuit and a memory circuit. For example, the memory circuit is an SRAM or the like. The LSI tester 100 tests logic and memory circuits that are mounted in a semiconductor device. In this case, the memory circuit is tested, for example, using a memory BIST (Built In Self Test) circuit or the like which is part of the logic circuit. The LSI tester 100 transmits the logic failure data 325 that is the test result of the logic circuit and the fail bit data 322 that is the test result of the memory circuit to the computer 300 through the communication network 200.

The computer 300 includes a processor 310 and a storage device 320. The storage device 320 comprises, for example, a hard disk drive, an SSD (Solid State Drive), a non-volatile storage device such as a flash memory, and a volatile storage device such as a RAM (Random Access Memory). The storage device 320 stores the failure analysis tool 329 and the layout tool 330, which are programs. When the processor 310 executes the failure analysis tool 329 and the layout tool 330, the computer 300 functions as the failure analysis device.

The storage device 320 also stores fail bit data 322 and logic failure data 325 from the LSI tester 100 as data. In addition to this, the storage device 320 stores memory circuit data 321, physical address data 323, memory failure data 324, failure diagnosis data 326, data 327 of a memory connection port, and layout data 328. The Layout data 328 is used by layout tool 330 in displaying a layout of a semiconductor device on display device 350, for example.

Figure 2:
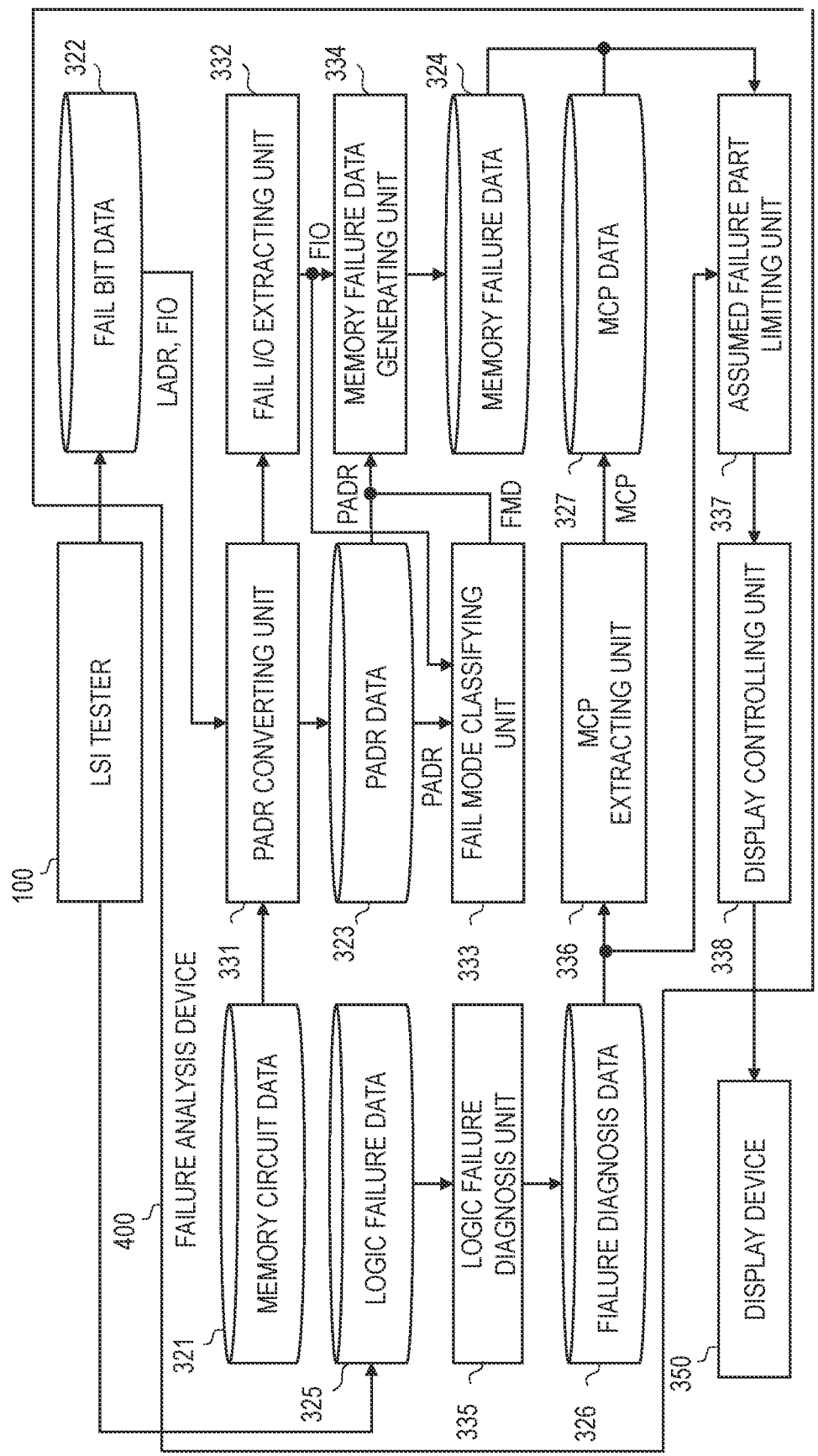
FIG. 2 is a functional block diagram showing a configuration example of a main part of the failure analysis device realized by using the configuration of FIG. 1.

FIG. 2 is a functional block diagram showing a configuration example of a main part of the failure analysis device realized by using the configuration of FIG. 1. The failure analysis device 400 shown in FIG. 2 is a device for analyzing a failure of a semiconductor device including a memory circuit and a logic circuit. The failure analysis device 400 includes a physical address converting unit 331, a fail I/O extracting unit 332, a failure mode classifying unit 333, a memory failure data generating unit 334, a logic failure diagnosis unit 335, a memory connection port (MCP) extracting unit 336, an estimated failure part limiting unit 337, and a display controlling unit 338.

The physical address converting unit 331, the fail I/O extracting unit 332, the failure mode classifying unit 333, the memory failure data generating unit 334, the logic failure diagnosis unit 335, the memory connection port (MCP) extracting unit 336, and the estimated failure point limiting unit 337 are realized by the processor 310 executing the failure analysis tool 329 stored in the storage device 320. The display controlling unit 338 is realized by executing a layout tool 330 in which the processor 310 is stored in the storage device 320.

The failure analysis device 400 stores the memory circuit data 321, the fail bit data 322, the physical address data 323, the memory failure data 324, the logic failure data 325, the failure diagnosis data 326, and the data 327 of the memory connection port shown in FIG. The fail bit data 322 includes a fail logic address LADR and a fail I/O value FIO obtained by testing the memory circuitry using the LSI tester 100 to identify the failed memory cell.

The memory circuit data 321 includes, for example, the fail logical address LADR and the information required to convert the fail I/O value FIO to a fail physical address PADR. The physical address converting unit 331 converts the fail logical address LADR and the fail I/O value FIO into a fail physical address PADR using the memory circuit data 321. A logical address is an address that is input to a memory circuit and represents a logical arrangement order of memory cells in a memory array in the memory circuit. On the other hand, physical addresses are addresses in the memory array that represent the physical placement order of the memory cells.

That is, in a memory array, logical addresses are not usually assigned sequentially to the physical arrangement of memory cells. When performing the failure analysis, the physical arrangement or arrangement order of failed memory cells is required. Therefore, the physical address converting unit 331 performs conversion to the fail physical address PADR by, for example, inputting the fail logical address LADR and the fail I/O value FIO into a predetermined arithmetic expression based on the memory circuit data 321. The physical address converting unit 331 creates the physical address data 323 including the fail physical address PADR.

The fail I/O extracting unit 332 extracts the fail I/O value FIO from the fail bit data 322 in parallel with the process of the physical address converting unit 331. Based on the fail physical address PADR included in the physical address data 323 and the fail I/O value FIO extracted by the fail I/O extracting unit 332, the failure mode classifying unit 333 classifications the fail bits into one of the failure mode FMD among a plurality of failure mode FMD.

The plurality of bad mode FMD includes bit failure mode, line failure mode and I/O block failure mode. The bit failure mode is a mode in which fail bits exist isolated. The line failure mode is the mode where multiple fail bits reside on the same bit line or the same word line in the memory array. The I/O block failure mode, for example, in the same I/O port, a mode when a predetermined number or more of bit line failure is at least two or more occurs.

The memory failure data generating unit 334 generates the memory failure data 324 by integrating the fail physical address PADR from the physical address converting unit 331, the fail I/O value FIO from the fail I/O extracting unit 332, and the failure mode FMD from the failure mode classifying unit 333.

The logic failure diagnosis unit 335 performs failure diagnosis on the logic circuitry tested by the LSI tester 100, that is, on the logic failure data 325. Then, the logic failure diagnosis unit 335 creates a: failure diagnosis data 326 obtained by the failure diagnosis. Specifically, in testing logic circuitry, an output pattern for various input patterns is typically observed by the LSI tester 100 to determine whether the output pattern matches/does not match the expected value pattern. The logic failure diagnosis unit 335 comprehensively diagnoses the determination result of the match/mismatch, determines the port in the logic circuit, the logic cells and the logic wiring or the like in detail in the estimated failure part.

At this time, the logic failure diagnosis unit 335, the memory connection port is a connection port to the memory circuit in the logic circuit, there is a case to determine the estimated failure part. The failure diagnosis data 326 is data including the list information of the estimated failure parts. The logic failure diagnostic unit 335 is implemented by a part of the failure analysis tool 329, a commonly known EDA (Electronic Design Automation) tool. Such an EDA tool may also create an entry-pattern that takes failure detection rates into account.

The memory connection port extracting unit 336 extracts data 327 of the memory connection port MCP from among the estimated failure parts included in the failure diagnosis data 326. Specifically, the memory connection port extraction unit 336 determines whether or not the memory connection port MCP is included as the estimated failure part in the failure diagnosis data 326 and performs the extraction process when the memory connection port MCP is included. The estimated failure part limiting unit 337 limits the estimated failure part on the basis of the memory failure data 324 and the data 327 of the memory connection port, although details will be described later.

The display controlling unit 338 displays the information of the estimated failure part limited by the estimated failure part limiting unit 337 on the display device 350. At this time, the display controlling unit 338 may display, for example, a layout screen or the like of the semiconductor device in which the estimated failure part is emphasized on the display device 350 by inputting information of the estimated failure part with respect to the layout tool 330.

(Details of Estimated Failure Part Limiting Unit)

FIG. 3 is a diagram illustrating an example of main processing contents of the estimated failure part limiting unit 337 in FIG. 2. FIG. 3 shows an example of the data 327 of the memory connection ports of FIGS. 1 and 2 and an example of the memory failure data 324. The data 327 of the memory connection port is also a part of the failure diagnosis data 326. The data 327 of the memory connection port illustrated in FIG. 3 includes the score information 361, the instance name 362, and the memory module name 364.

The score information 361 represents the high reliability of the diagnosis by the logic failure diagnosis unit 335, that is, the estimated failure part. The memory module name 364 is a name determined for each configuration of the memory circuitry. For example, if the configurations such as the capacitance and the number of I/O are different, the names are determined to differ. For example, the instance name 362 is a name determined for each individual memory circuit when a plurality of memory circuits having a certain memory module name 364 are mounted in the semiconductor device.

The instance name 362 contains information about MCP of the memory-attached ports. The information representing the memory connection port MCP is composed of the identification information 363 that distinguishes the input port from the memory circuit or the output port to the memory circuit, the identification information "Q" representing the output port in this example, the port ID value PID of the port, and "46" in this example.

Meanwhile, the memory failure data 324 includes a fail physical address PADR, a failure mode FMD, a memory module name 366, a fail I/O value FIO, and an instance name 365. The memory module name 366 and the instance name 365 are similar to those of the memory connection port data 327 described above. However, the instance name 365 does not include information representing the memory connection port MCP, unlike the instance name 362 in the data 327 of the memory connection port. Also, the memory module name 366 and the instance name 365 are described in fail-bit data 322 as information to be tested.

Here, the estimated failure part limiting unit 337 compares the identity of the instance name 362 and the memory module name 364 in the data 327 of the memory connection port with the instance name 365 and the memory module name 366 in the memory failure data 324. Then, when the instance names of each other and the memory module names are the same, the estimated failure part limiting unit 337 determines match/not-match between the fail I/O value FIO included in the memory failure data 324 and the port ID value PID included in the data 327 of the memory connecting port.

In designing a semiconductor device, the port ID value PID is usually determined by a value based on I/O value of the memory circuit in order to define the connecting relation between the logic circuit and the memory circuit. Therefore, when the fail I/O value FIO and the port ID value PID match, the estimated failure part generated in the logic circuit, and the fail bit generated at I/O port "46" of the memory circuit may be related to "Q [46]" which is the memory connecting port MCP in this embodiment.

Further, in the exemplary memory failure data 324 shown in FIG. 3, the failure mode FMD is I/O block failure mode. In particular, in such cases, due to a failure of the memory connecting port MCP in the logic circuit or a failure on the signal transmission of the port, there is a high possibility that I/O blocking failure has occurred in the memory circuit. On the other hand, from the viewpoint of memory failure analysis, if only the memory failure data 324 is referred to, it is not easy to identify or narrow down the failure part causing I/O blocking failure. In addition, from the viewpoint of logic failure analysis, even if the memory connection port MCP is included in the estimated failure part, the memory connection port MCP is not always a failure part.

Therefore, in particular, when I/O blocking failure occurs, it is beneficial to verify the fail I/O value FIO and the port ID value PID. Thus, when the verification result is a match, it is possible to easily identify or narrow down the estimated failure part and thus the failure part. In other words, from the viewpoint of memory failure analysis, the estimated failure part causing I/O blocking failure can be narrowed down around the memory connecting port MCP. Furthermore, from the viewpoint of logic failure analysis, it is possible to increase the accuracy that the memory connection port MCP is a failure part.

Figures 4A, 4B:
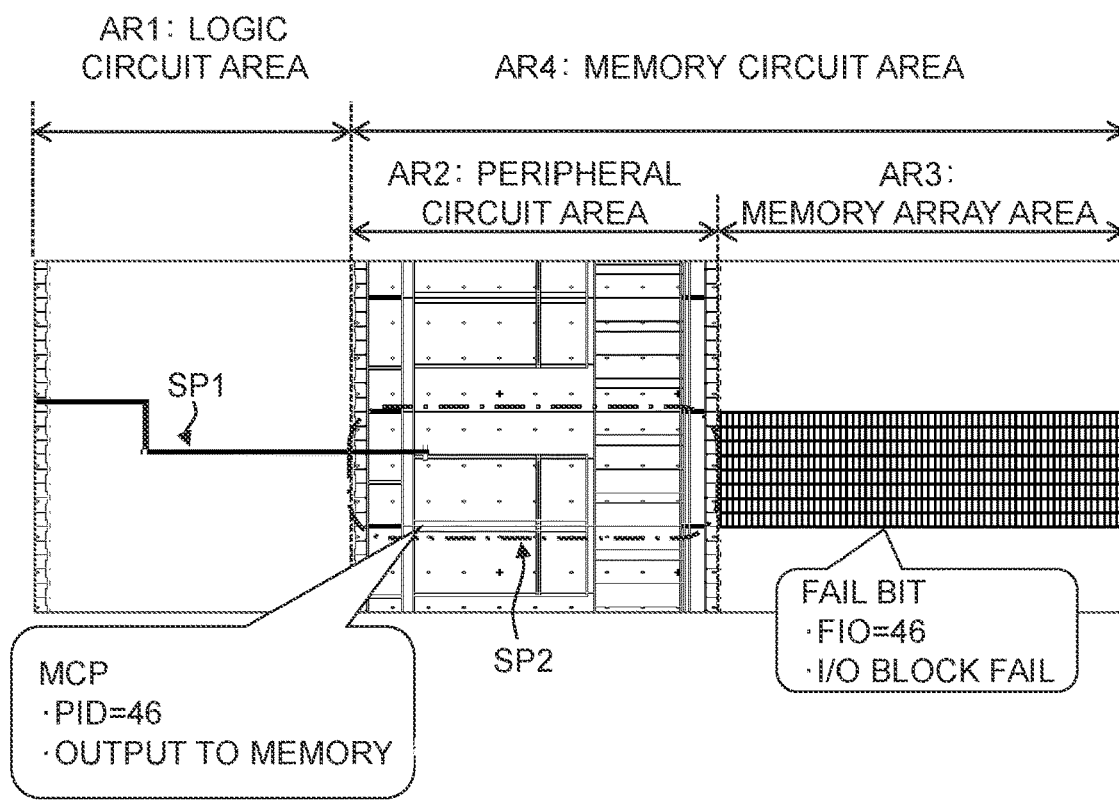
FIG. 4A is a diagram illustrating an exemplary process in which the estimated failure part limiting unit in FIG. 2 limits the estimated failure part.
FIG. 4B is a specific example of the process details shown in FIG. 4A, and is a diagram showing an example of a schematic layout around the estimated failure part.

FIG. 4A is a diagram illustrating an exemplary process in which the estimated failure part limiting unit 337 in FIG. 2 limits the estimated failure part. FIG. 4B is a specific example of the process details shown in FIG. 4A, and is a diagram showing an example of a schematic layout around the estimated failure part. In FIG. 4A, the estimated failure part limiting unit 337 determines match/not-match between the fail I/O value FIO and the port ID value PID when the failure mode FMD of the fail bit is I/O block failure mode. Then, when the fail I/O value FIO and the port ID value PID match, the estimated failure part limiting unit 337 limits the estimated failure part to a related part of the memory connection port MCP in a logic circuit area AR1 or a peripheral circuit area AR2.

Specifically, as shown in FIG. 4B, the semiconductor device is provided with a logic circuit area AR1 and a memory circuit area AR4. The memory circuit area AR4 has a peripheral circuit area AR2 that is connected to the logic circuit area AR1 and a memory array area AR3 that is connected to the logic circuit area AR1 via the peripheral circuit area AR2. The memory array area AR3 includes a plurality of memory cells arranged in a matrix-like manner and word lines and bit lines connected to a plurality of memory cells. The peripheral circuit area AR2 includes drivers for driving word-lines and bit-lines, and sense amplifiers for amplifying bit-line signals.

The logic circuit area AR1 includes a memory-connected port MCP, which is an estimated failure part. In this instance, the memory connection port MCP is an output port to the memory circuitry and has "46" as the port ID value PID. In addition, the memory array area AR3 includes a large number of fail bits classified as failure I/O blocks at I/O port of "46" which is the fail I/O value FIO.

In this way, when the fail I/O value FIO and the port ID value PID match, the estimation failure part limiting unit 337 limits the estimated failure part to the signal transmission path SP1 of the memory connection port MCP in the logic circuit or the signal transmission path SP2 of the memory connection port MCP in the peripheral circuit in the memory circuit. Then, for example, the estimated failure part limiting unit 337 displays a layout screen as emphasizing the signal transmission path SP1 in FIG. 4B on the display device 350 through the display controlling unit 338.

Further, in FIG. 4A, the estimated failure part limiting unit 337 determines the estimated failure part in the whole area of the peripheral circuit area AR2 when the failure mode FMD is I/O block failure mode and when the fail I/O value FIO and the port ID value PID are mismatched. In this case, for example, separately, using a light emission analysis or the like, it is necessary to identify or narrowing the failure part.

On the other hand, the estimated failure part limiting unit 337 determines the estimated failure part in the target part at or around the memory array area AR3 when the failure mode FMD is not I/O block failure mode, that is, the bit failure mode or the line failure mode. In particular, the estimated failure part is defined in the corresponding memory cell when the bit failure mode is selected, and is defined in the corresponding bit line or word line or the corresponding driver or sense amplifier when the line failure mode is selected.

(Failure Analysis Method)

Figure 5:
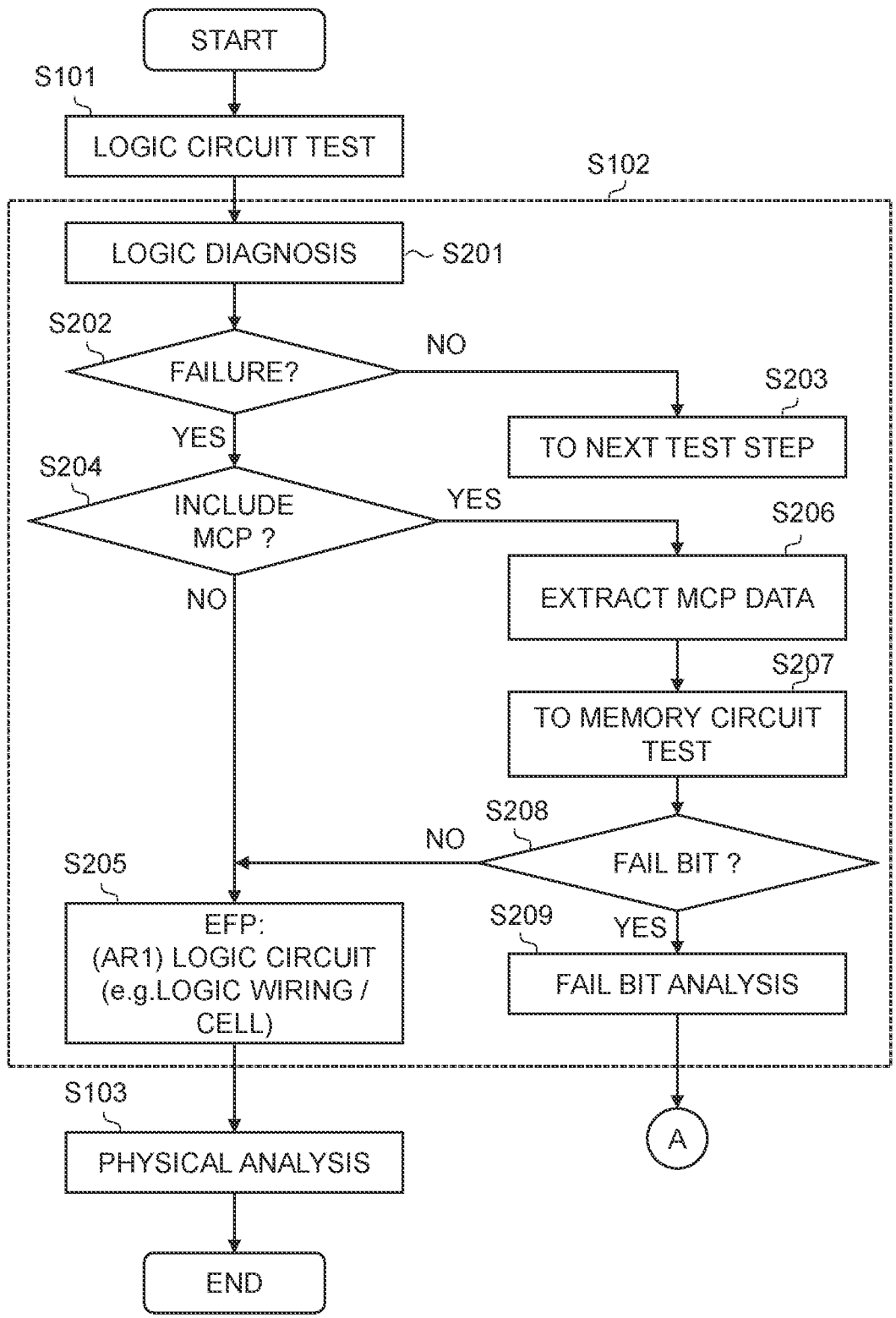
FIG. 5 is a flow chart showing an example of processing contents using the failure analysis system shown in FIGS. 1 and 2 in the failure analysis method according to the first embodiment.
Figure 6:
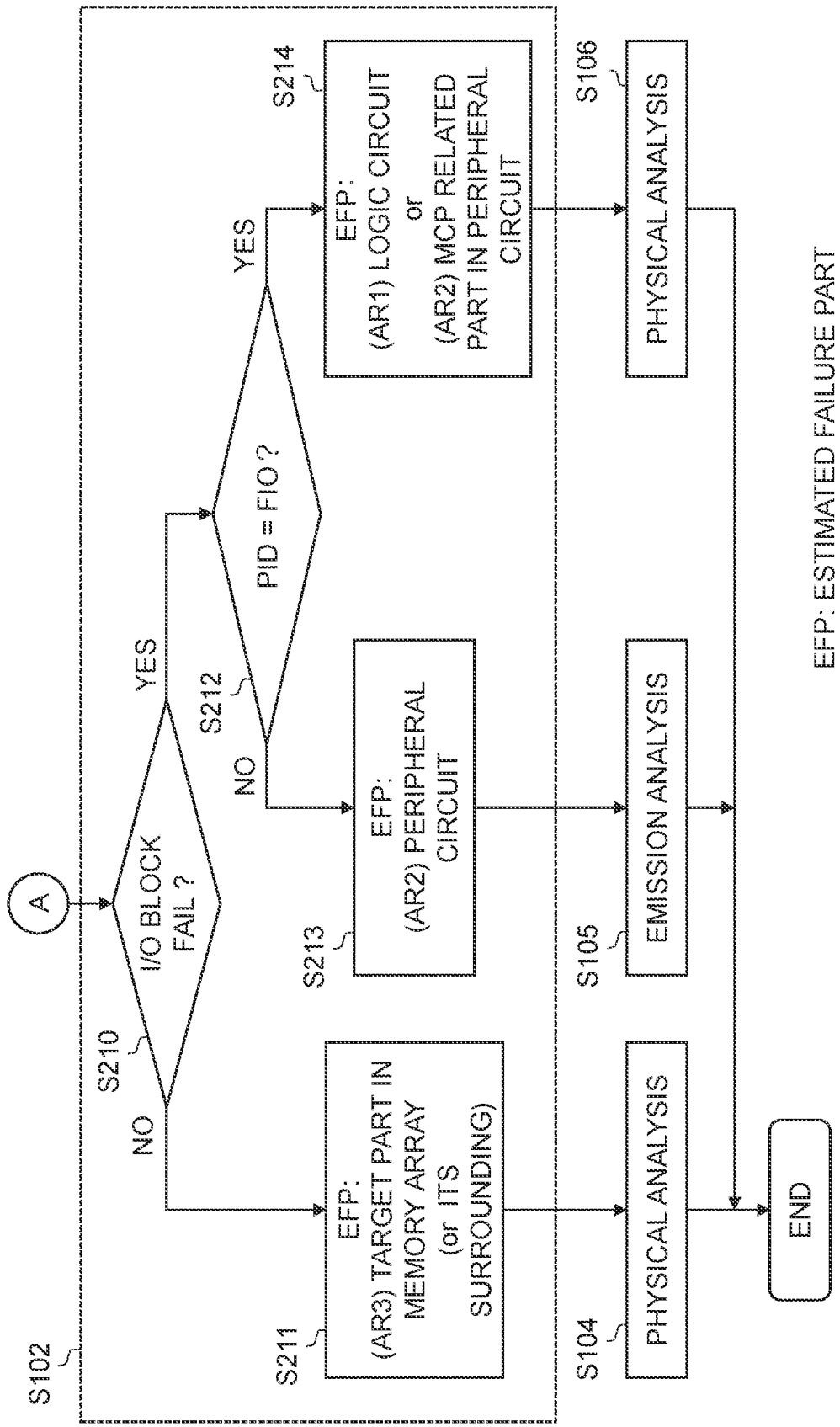
FIG. 6 is a flowchart showing an example of the processing contents following FIG. 5.

FIG. 5 is a flow chart showing an example of processing contents using the failure analysis system shown in FIGS. 1 and 2 in the failure analysis method according to the first embodiment. FIG. 6 is a flowchart showing an example of the processing contents following FIG. 5. In FIG. 5, first, the LSI tester 100 performs a logic circuit test on the logic circuits in the semiconductor device (step S101). Subsequently, a plurality of processes included in the step S102, that is, the process of the step S201 to S214 is performed using the failure analysis device 400 illustrated in FIG. 2 and the processor 310 specifically illustrated in FIG. 1.

In step S102, first, the logic failure diagnosis unit 335 performs failure diagnosis for the logic failure data 325 is a consequence of the logic circuit test (step S201). Subsequently, the failure analysis device 400, based on the outcome of the failure diagnostic, determines whether there is a logic failure (S202 of steps). If there is no logic failure (step S202: NO), the process proceeds to the subsequent testing process (step S203). On the other hand, when there is a logic failure (step S202: YES), the memory connection port extracting unit 336 determines whether or not the memory connection port MCP is included in the estimated failure part in the logic circuitry, that is, the failure diagnosis data 326 (step S204).

When the failure diagnosis data 326 does not include the memory connection port MCP (Step S204: NO), the memory connection port extracting unit 336 notifies the estimated failure part limiting unit 337 of the fact. In response to this, the estimated failure part limiting part 337 determines the estimated failure part in the logic circuit area AR1, in particular, the logic wire and the logic cell described in the failure diagnostic data 326 (step S205). In this instance, a physical analysis, etc. targeting the estimated failure part is performed thereafter (step S103).

On the other hand, when the memory connection port MCP is included in the failure diagnosis data 326 (step S204: YES), the memory connection port extracting unit 336 extracts the data 327 of the memory connection port (step S206). Subsequently, the failure analysis device 400 causes the LSI tester 100 to perform the memory circuit test for the memory circuit in the semiconductor device (step S207). In response to this, the LSI tester 100 executes a memory circuit test using, for example, a memory BIST circuit or the like in the logic circuit included in the semiconductor device, and notifies the failure analysis device 400 of the test result.

The failure analysis device 400 receives the test result from the LSI tester 100, and determines the presence or absence of a fail bit (step S208). If there is no fail bit (step S208: NO), the failure analysis device 400 proceeds to step S205. On the other hand, when there is a fail bit (step S208: YES), the failure analysis device 400 analyzes the fail bit (step S209).

In step S209, specifically, the conversion to the fail physical address PADR by the physical address conversion unit 331, the extraction of the fail I/O value FIO by the fail I/O extracting unit 332, and the classification of the failure mode FMD by the failure mode classification unit 333 are performed. Further, based on the processing results, the creation of the memory failure data 324 by the memory failure data generating unit 334 is performed.

Then, as illustrated in FIG. 6, the estimated failure part limiting unit 337 determines whether or not the failure mode FMD is I/O block failure mode based on the classification of the failure mode FMD (step S210). When the failure mode FMD is not I/O block failure mode (step S210: NO), the estimated failure part limiting unit 337 determines that the estimated failure part is the memory array area AR3 or the target part at or around AR3 as described in FIGS. 4A and 4B (step S211). Then, a physical analysis or the like for the estimated failure part can be performed thereafter (step S104).

On the other hand, when the failure mode FMD is I/O block failure mode (step S210: YES), the estimated failure part limiting part 337 determines match/not-match between the port ID value PID and the fail I/O value FIO, as described in FIG. 3 (step S212). Here, when the port ID value PID and the fail I/O value FIO are not matched (step S212: NO), the estimated failure part limiting part 337 determines the estimated failure part in the whole area of the peripheral circuit area AR2 as described in 4A and 4B of the drawings (step S213). In this case, thereafter, it is required to perform a light emission analysis or the like for identifying or narrowing the failure generating unit (step S105).

On the other hand, when the port ID value PID and the fail I/O value FIO match (step S212: YES), the estimated failure part limiting unit 337 limits the estimated failure part to the related part of the memory connecting port MCP in the logic circuit area AR1 or the peripheral circuit area AR2, as shown in FIG. 4A. That is, the estimated failure part limiting part 337, for example, as shown in FIG. 4B, limits the estimated failure part to the signal transmission path SP1 of the memory connection port MCP in the logic circuit, or the signal transmission path SP2 of the memory connection port MCP in the peripheral circuit. Then, thereafter, without passing through the emission analysis or the like, the physical analysis or the like for the estimated failure part can be performed (step S106).

As described above, in the system of the first embodiment, when the memory connection port is included in the estimated failure part in the logic circuit and a fail bit occurs in the memory circuit, the port ID of the memory connection port is checked against the fail I/O of the fail bit. Thus, it is possible to determine whether there is a connection between the logic failure and the memory failure. In this case, in particular, when the verification result is matched and the fail bit is classified as a I/O block failure, it is possible to identify or narrow down the estimated failure part by judging that there is a relation.

This makes it possible to increase the efficiency of failure analysis. Specifically, the time required for the analysis can be reduced because the estimated failure part can be identified or narrowed down without performing emission analysis or detailed investigation of the layout and the circuit diagram. Further, as a result, it is possible to increase the yield of the semiconductor device at an early stage.

Second Embodiment (Configuration of Failure Analysis System)

Figure 7:
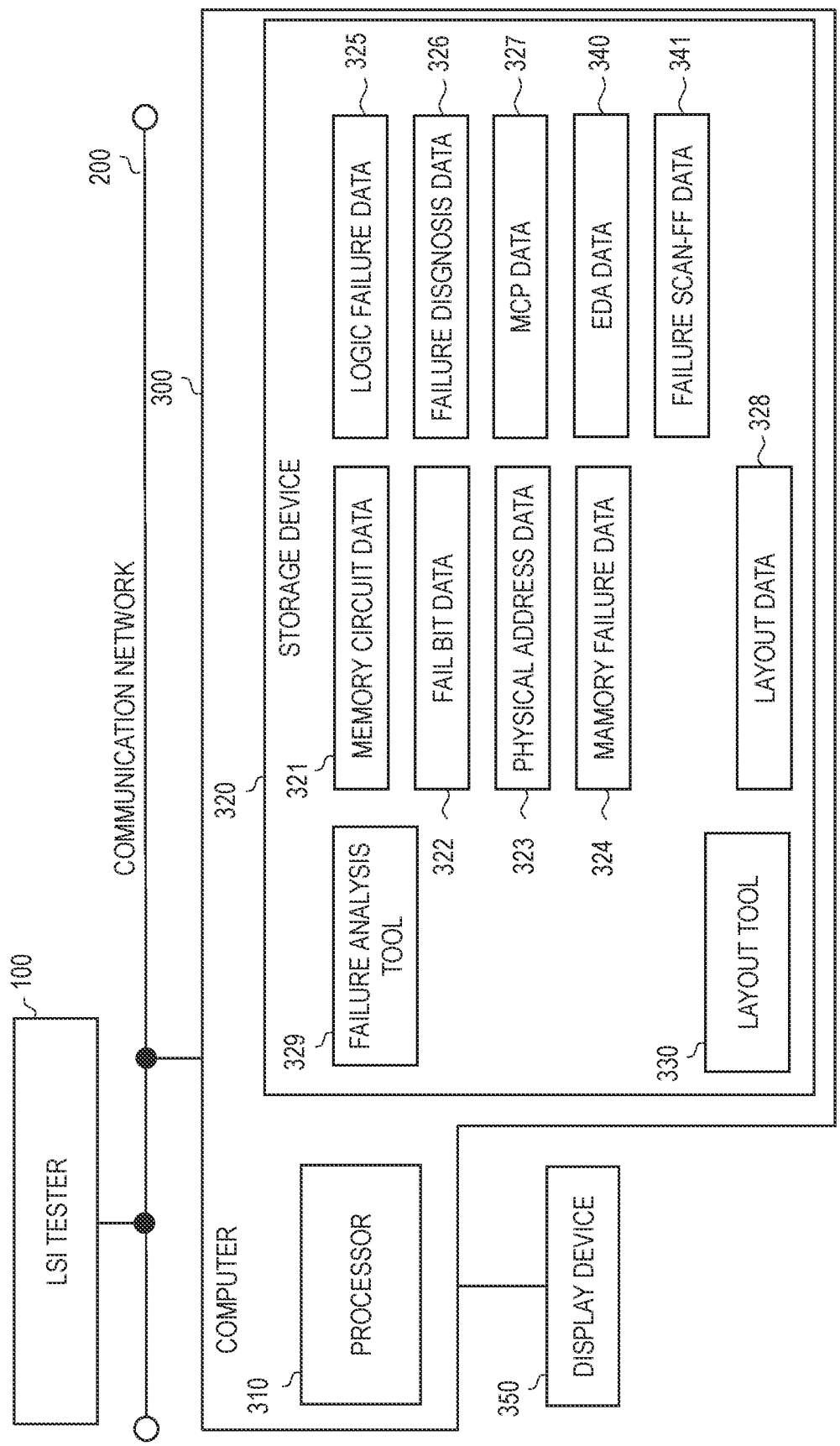
FIG. 7 is a schematic diagram showing a configuration example of a failure analysis system according to a second embodiment.

FIG. 7 is a schematic diagram showing a configuration example of a failure analysis system according to a second embodiment. The failure analysis system shown in FIG. 7, as compared with the configuration example shown in FIG. 1, the data stored in the storage device 320 in the computer 300 are different. That is, the storage device 320 shown in FIG. 7 further stores the EDA data 340 and failure scan flip-flop data 341 in addition to the various data shown in FIG. 1.

Figure 8:
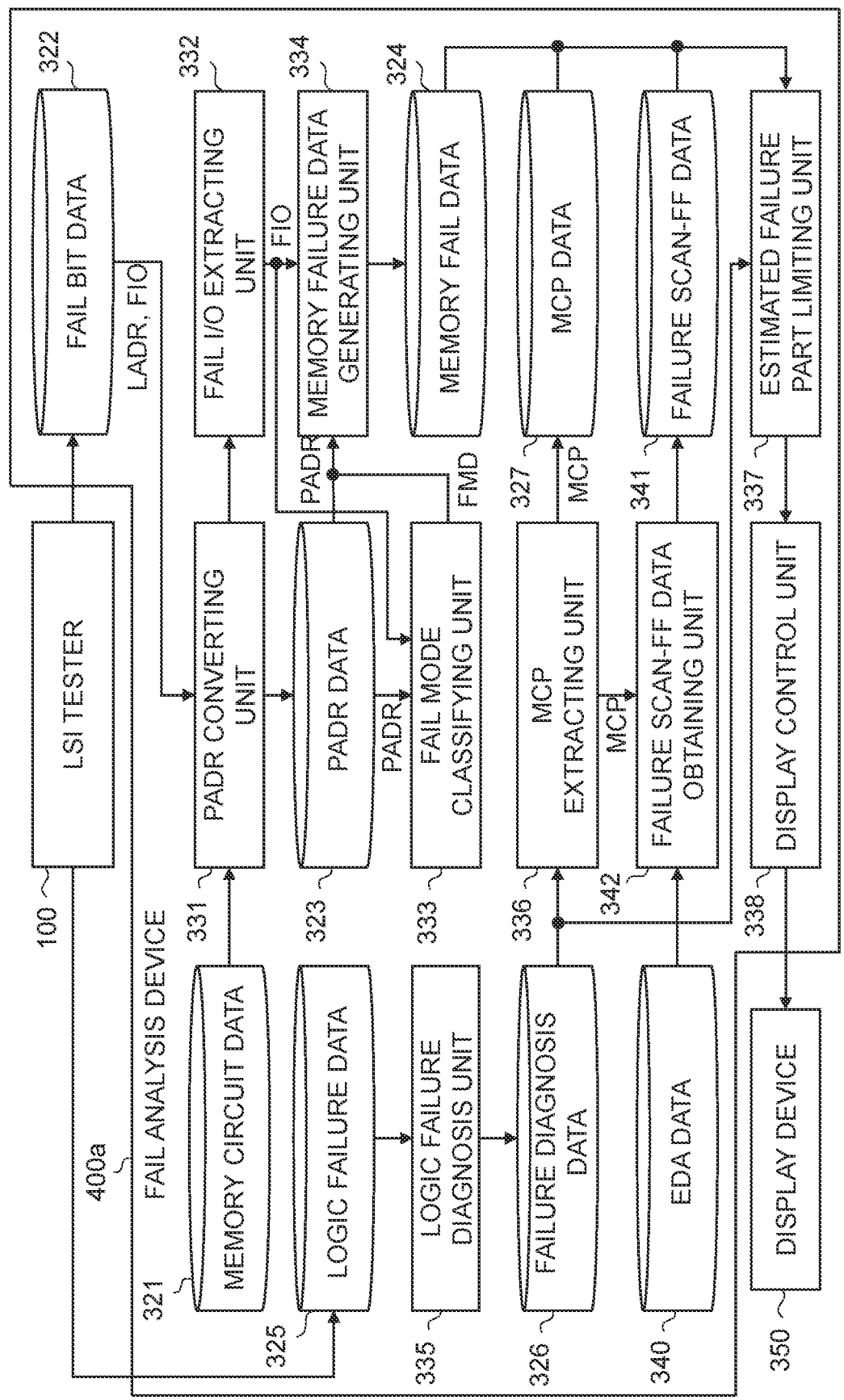
FIG. 8 is a functional block diagram showing a configuration example of a main part of the failure analysis device realized by using the configuration of FIG. 7.

FIG. 8 is a functional block diagram showing a configuration example of a main part of the failure analysis device realized by using the configuration of FIG. 7. The failure analysis device 400a illustrated in FIG. 8 further includes a failure scan flip-flop data obtaining unit 342 for the configuration shown in FIG. 2. Along with this, the failure analysis device 400a stores the EDA data 340 and failure scan flip-flop data 341 shown in FIG. 7. Furthermore, unlike the case of FIG. 2, the estimated failure part limiting part 337 limits the estimated failure part using the failure scan flip-flop data 341 in addition to the memory failure data 324 and the data 327 of the memory connection port.

The failure scan flip-flop data obtaining unit 342 is also implemented by the processor 310 illustrated in FIG. 7 executing a failure analysis tool 329 in the storage device 320. The failure scan flip-flop data obtaining unit 342 obtains data corresponding to the memory connection port MCP from EDA data 340 as the failure scan flip-flop data 341 based on the information of the memory connection port MCP extracted by the memory connection port extracting unit 336.

(Details of Failure Scan Flip-Flop Data Obtaining Unit)

FIG. 9 illustrates an exemplary of EDA data 340 of FIGS. 7 and 8. The EDA data 340 shown in FIG. 9 includes a scan chain data 345. The scan chain data 345 is provided by the number of scan chains that are mounted within the semiconductor device, and specifically within the logic circuitry. Each scan chain is distinguished by a scan chain name 370.

Each scan chain data 345 includes, in addition to a scan chain name 370, a scan-in port name 371, a scan-out port name 372, and detailed information for a plurality of scan flip-flops that make up the scan chain. The detailed information includes identification information 373, such as a number, for each of a plurality of scan flip-flops, an instance name 374, a logic cell name 375, and layout placement information 376, such as layout coordinates.

The failure scan flip-flop data obtaining unit 342 obtains, from among such scan chain data 345, data corresponding to the memory-connected port MCP as failure scan flip-flop data 341. Specifically, the failure scan flip-flop data obtaining unit 342 receives the information of the memory connection port MCP including the instance name from the memory connection port extracting unit 336 and searches for the instance name 374 that matches the instance name from among the scan chain data 345.

Then, the failure scan flip-flop data obtaining unit 342 obtains the data of the scan flip-flop hit by the search as the failure scan flip-flop data 341. In this example, the failure scan flip-flop data obtaining unit 342 receives an instance name including "Q[46]" which is information of the memory-connection port MCP, and obtains data of the scan flip-flop corresponding to the instance name as the failure scan flip-flop data 341.

(Details of Estimated Failure Part Limiting Unit)

Figures 10A, 10B:
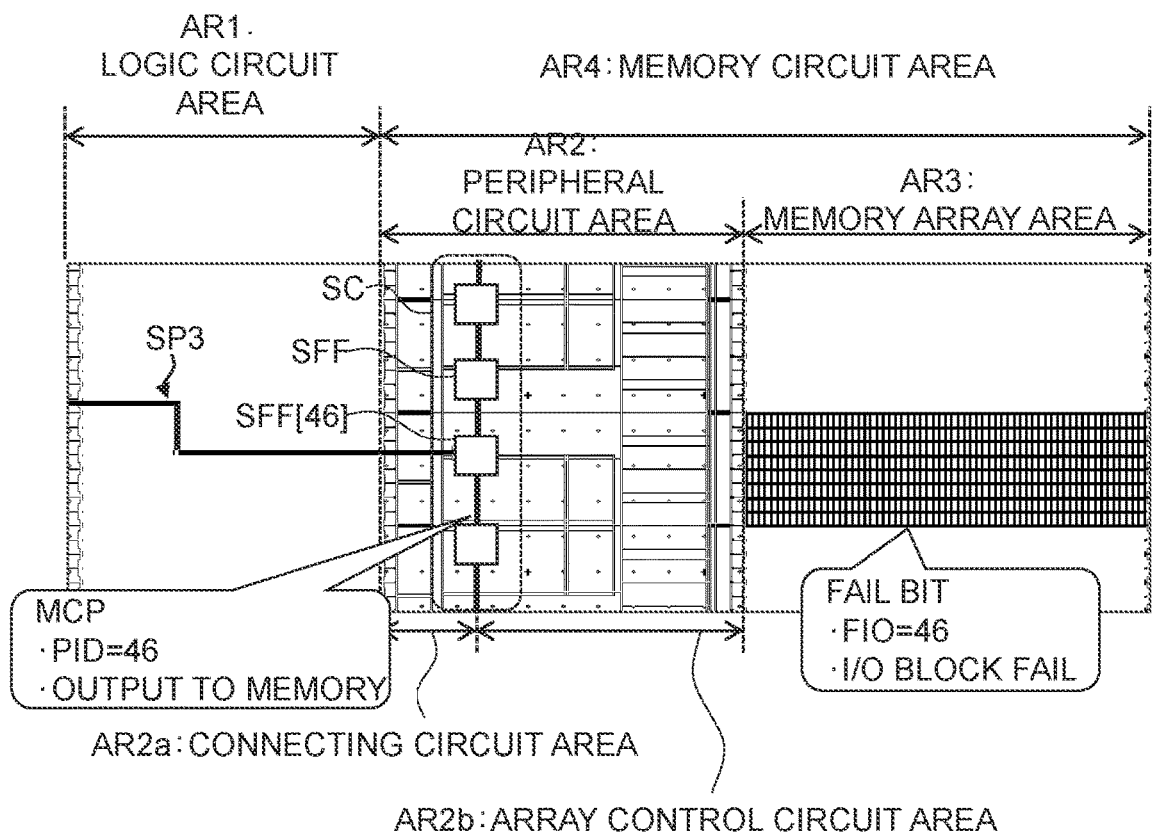
FIG. 10A is a diagram illustrating an exemplary process in which the estimated failure part limiting part in FIG. 8 limits the estimated failure part.
FIG. 10B is a specific example of the process details shown in FIG. 10A, and is a diagram showing an example of a schematic layout around the estimated failure part.

FIG. 10A is a diagram illustrating an exemplary process in which the estimated failure part limiting part 337 in FIG. 8 limits the estimated failure part. FIG. 10B is a specific example of the process details shown in FIG. 10A, and is a diagram showing an example of a schematic layout around the estimated failure part. FIG. 10A differs from the FIG. 4A described above in the location of the estimated failure when I/O blocking failure occurs.

The estimated failure part limiting unit 337, when I/O block failure occurs, when the fail I/O value FIO and the port ID value PID match, the estimated failure part is limited to the related part of the memory connection port MCP in the logic circuit area AR1 or the connection circuit area AR2a. On the other hand, the estimated failure part limiting unit 337 determines the estimated failure part in the array control circuit area AR2b in general when I/O blocking failure occurs and when the fail I/O value FIO and the port ID value PID do not match each other.

Specifically, the peripheral circuit area AR2 in the memory circuit shown in FIG. 4B can be separated into the connecting circuit area AR2a and the array-control circuit area AR2b as shown in FIG. 10B. The array control circuit area AR2b is connected to the memory array area AR3 and is mainly a circuit area composed of analogue circuits such as drivers and sense amplifiers. Connected circuit area AR2a is a circuit area that is responsible for interfacing the logic circuit area AR1 and the array control circuit area AR2b, a circuit area composed of digital circuits.

The connecting circuit area AR2a and the array control circuit area AR2b are separated as bounded by the scan chain SC as shown in the FIG. 10B. Every scan flip-flop SFF included in the scan chain SC, for example, is responsible for holding the incoming or outgoing data of the memory circuitry. Here, in the exemplary embodiment shown in FIG. 10B, the memory-connected port MCP, which is the estimated failure part, has a scan flip-flop SFF[46] in which the port ID value PID is "46". In addition, the positions of the scan flip-flop SFF are found by layout placement information 376 included in the failure scan flip-flop data 341 shown in FIG. 9.

Therefore, the estimated failure part limiting unit 337 determines the border of the estimated failure part based on the layout arrangement information 376. Then, the estimated failure part limiting unit 337, when the fail I/O value FIO and the port ID value PID match, limits the estimated failure part to the signal transmission path SP3 of the memory connecting port MCP, which is located at the logic circuit-side rather than the defined border, as shown in FIG. 10B. Thus, it is possible to further narrow down the estimated failure part than that of FIG. 4B.

On the other hand, when the fail I/O value FIO and the port ID value PID do not match, the estimated failure part limiting unit 337 determines the estimated failure part in the array control circuit area AR2b that is located on the memory circuit side with the scan chain SC as the border. Thus, the estimated failure part can be narrowed down slightly more than the cases of FIGS. 4A and 4B.

(Failure Analysis Method)

Figure 11:
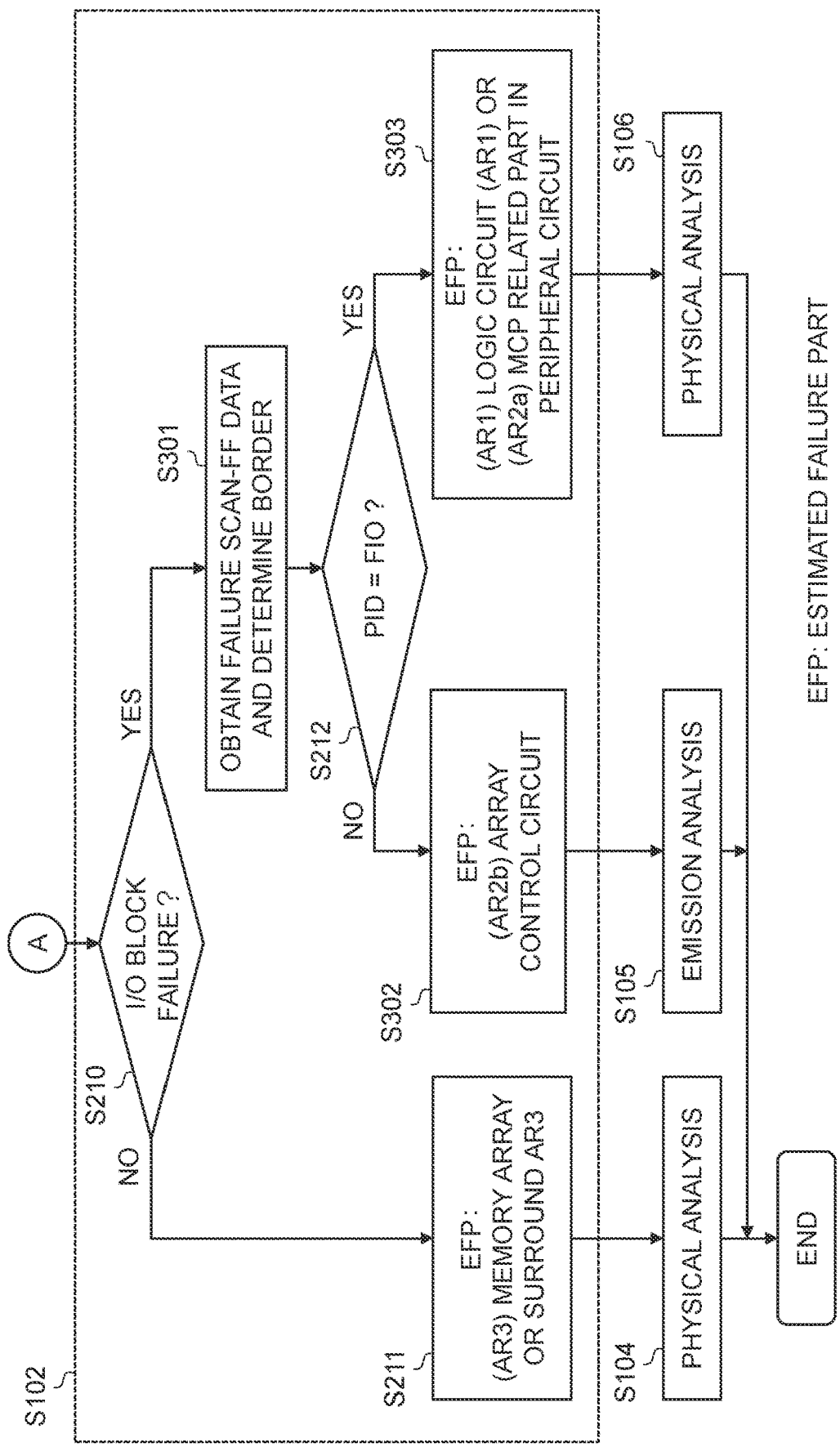
FIG. 11 is a flow chart showing an example of the processing contents following FIG. 5 in the failure analysis method according to the second embodiment.

FIG. 11 is a flow chart showing an example of the processing contents following FIG. 5 in the failure analysis method according to the second embodiment. In the flow shown in FIG. 11, compared to the flow shown in FIG. 6, a step S301 has been added between the step S210 and the step S212, and the step S213, S214 has been replaced by the step S302, S303, respectively.

In the step S301, when the failure mode FMD is I/O block failure mode (step S210: YES), the estimated failure part limiting unit 337 obtains data corresponding to the memory connecting port MCP as the failure scan flip-flop data 341 from the scan chain data 345 as illustrated in FIG. 9. Then, the estimated failure part limiting unit 337 determines the border of the estimated failure part on the basis of the layout arrangement information 376 included in the failure scan flip-flop data 341 and proceeds to step S212.

Further, in the step S302, when the fail I/O value FIO and the port ID value PID do not match (step S212: NO), the estimated failure part limiting part 337 determines the estimated failure part in the array control circuit area AR2b as described in FIGS. 10A diagram and 10B. In this instance, since the region is still wide, emission analysis and the like must be performed thereafter (step S105).

On the other hand, in the step S303, when the fail I/O value FIO and the port ID value PID match (step S212: YES), the estimated failure part limiting unit 337 determines the estimated failure part as an associated part of the memory connection port MCP in the logic circuit area AR1 or the connection circuit area AR2a, as shown in the drawing 10A. That is, the estimated failure part limiting unit 337, as shown in FIG. 10B, limits the estimated failure part to the signal transmission path SP3 of the memory connecting port MCP, which is located at the logic circuit-side of the defined border. In this case, thereafter, the physical analysis and the like for the estimated failure part, can be performed more efficiently than in the case of FIG. 6 (step S106).

Key Effects of the Second Embodiment

Above, also by using the scheme of the second embodiment, the same effects as the various effects described in the first embodiment can be obtained. Furthermore, by using the data of the scan flip-flop SFF, the estimated failure part can be further narrowed down, so that the efficiency of the failure analysis can be further increased compared with the case of the first embodiment.

Although the invention made by the present inventor has been specifically described based on the embodiment, the present invention is not limited to the embodiment described above, and it is needless to say that various modifications can be made without departing from the gist thereof.

For example, in the failure analysis device 400, 400a shown in FIG. 2 or FIG. 8, part or all of the components are not limited to programming by the processor, it may be implemented in other forms. Specifically, for example, some or all of the components (331-338, 342) shown in FIG. 8 may be implemented in hardware such as FPGA (Field Programmable Gate Array) or ASIC (Application Specific Integrated Circuit), or may be implemented in a combination of software and hardware.

The program described above may also be supplied to a computer on a non-temporary tangible computer-readable recording medium. Such a recording medium, for example, a magnetic recording medium represented by a hard disk drive or the like, an optical recording medium represented by a DVD (Digital Versatile Disc) or a Blu-ray disk or the like, a semiconductor-based memory represented by a flash memory or an SSD or the like.

What is claimed is:

1. A failure analysis device for analyzing a failure of a semiconductor having a logic circuit and a memory circuit, comprising:
   a storage device for storing fail bit data obtained by testing the memory circuit, and failure diagnosis data obtained by failure diagnosis for the test results of the logic circuit, and
   a processor,
   wherein the processor extracts a fail I/O from the fail bit data, and extracts data of a memory connection port which is a connection port to the memory circuit from an estimated failure part included in the failure diagnosis data, and determines whether the fail I/O and a port ID included in the data of the memory connection port match or not.

2. The failure analysis device according claim 1,
wherein the processor converts a fail logical address and the fail I/O included in the fail bit data to a fail physical address, and classifies the fail bit data into any of a plurality of failure modes including a line failure mode and an I/O block failure mode based on the fail physical address and the fail I/O, and determines match/mismatch between the fail I/O value and the port ID value when the classified result of the failure mode is the I/O block failure mode.

3. The failure analysis device according to claim 2,
wherein the processor, when the fail I/O and the port ID match, limits the estimated failure part to a signal transmission path of the memory connection port in the logic circuit, or a signal transmission path of the memory connection port in a peripheral circuit in the memory circuit.

4. The failure analysis device according to claim 2,
wherein the storage device further stores scan chain data including identification information for each of a plurality of scan flip-flops constituting a scan chain and layout arrangement information for each of the plurality of scan flip-flops,
wherein the processor obtains the data corresponding to the memory connection port from the scan chain data as failure scan flip-flop data, and defines a border of the estimated failure part based on the layout arrangement information included in the failure scan flip-flop data.

5. The failure analysis device according to claim 4,
wherein the processor, when the fail I/O and the port ID match, limits the estimated failure part to a signal transmission path of the memory connecting port located at a logic circuit-side than the border.

6. A failure analysis method of a semiconductor device with a logic circuit and a memory circuit:
obtains a fail bit data by a test of the memory circuit, and failure diagnosis data by failure diagnosis for the test results of the logic circuit stored in a storage device,
extracts a fail I/O from the fail bit data,
extracts data of a memory connection port which is a connection port to the memory circuit from an estimated failure part included in the failure diagnosis data,
determines whether the fail I/O and a port ID included in the data of the memory connection port match or not.

7. The failure analysis method according to claim 6,
converts a fail logical address and the fail I/O included in the fail bit data to a fail physical address,
classifies the fail bit data into any of a plurality of failure modes including a bit failure mode, a line failure mode and an I/O block failure mode based on the fail physical address and the fail I/O,
determines a match/mismatch between the fail I/O and the port ID when the classified result of the failure mode is the I/O block failure mode.

8. The failure analysis method according to claim 7,
limits the estimation failure part to a signal transmission path of the memory connection port in the logic circuit, or a signal transmission path of the memory connection port in a peripheral circuit in the memory circuit, when the fail I/O and the port ID match.

9. The failure analysis method according to claim 7,
further stores scan chain data including identification information for each of a plurality of scan flip-flops constituting a scan chain and layout arrangement information for each of the plurality of scan flip-flops in the storage device,
obtains data corresponding to the memory connection port as failure scan flip-flop data from the scan chain data,
defines a border of the estimated failure part is defined based on the layout arrangement information included in the failure scan flip-flop data.

10. The failure analysis method according to claim 9,
when the fail I/O and the port ID match, limits the estimated failure part to a signal transmission path of the memory connection port located at a logic circuit side than the border.

* * * * *